United States Patent
Sato

(10) Patent No.: US 9,762,178 B2
(45) Date of Patent: Sep. 12, 2017

(54) SOLAR BATTERY CONTROL APPARATUS

(71) Applicant: TOYOTA JIDOSHA KABUSHIKI KAISHA, Toyota-shi, Aichi-ken (JP)

(72) Inventor: Daisuke Sato, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 35 days.

(21) Appl. No.: 14/931,282

(22) Filed: Nov. 3, 2015

(65) Prior Publication Data

US 2016/0181970 A1    Jun. 23, 2016

(30) Foreign Application Priority Data

Dec. 22, 2014    (JP) .................................. 2014-258361

(51) Int. Cl.

| | |
|---|---|
| *G06F 7/00* | (2006.01) |
| *H02S 20/32* | (2014.01) |
| *H01L 31/04* | (2014.01) |
| *B60L 8/00* | (2006.01) |
| *G05F 1/67* | (2006.01) |
| *B60L 15/20* | (2006.01) |

(52) U.S. Cl.
CPC .............. *H02S 20/32* (2014.12); *B60L 8/003* (2013.01); *B60L 15/2045* (2013.01); *G05F 1/67* (2013.01); *H01L 31/04* (2013.01)

(58) Field of Classification Search
CPC ...... H02S 20/32; B60L 8/003; B60L 15/2045; G05F 1/67; H01L 31/04; Y02E 10/58
USPC .......................................................... 701/36
See application file for complete search history.

(56) References Cited

U.S. PATENT DOCUMENTS

| | | | | |
|---|---|---|---|---|
| 2009/0133735 | A1* | 5/2009 | Yuguchi | G05F 1/67 |
| | | | | 136/244 |
| 2012/0126627 | A1* | 5/2012 | Tonicello | G05F 1/67 |
| | | | | 307/82 |
| 2013/0106371 | A1* | 5/2013 | Shimura | H01L 31/02021 |
| | | | | 323/234 |
| 2015/0268687 | A1* | 9/2015 | Miyoshi | G05F 1/67 |
| | | | | 701/36 |

FOREIGN PATENT DOCUMENTS

| | | |
|---|---|---|
| JP | 2012-178968 A | 9/2012 |
| WO | 2014/091777 A1 | 6/2014 |

* cited by examiner

*Primary Examiner* — Calvin Cheung
*Assistant Examiner* — Paula L Schneider
(74) *Attorney, Agent, or Firm* — Oliff PLC

(57) ABSTRACT

There is provided a solar battery control apparatus comprising: a solar battery in a vehicle; a vehicle speed detecting unit; a load circuit capable of be controlled to vary a generated current; and a control unit configured to perform MPPT control while controlling the load circuit to vary the generated current, wherein the control unit varies the generated current within a range having a certain upper limit value upon the speed of the vehicle being detected to be greater than a predetermined speed. The predetermined speed is set to be less than a speed at which the generated current becomes unable to be varied to correspond to a change in an i-V output characteristic of the solar battery, and the certain upper limit value is set to be less than a value of short-circuiting current having been reduced according to the change.

3 Claims, 8 Drawing Sheets

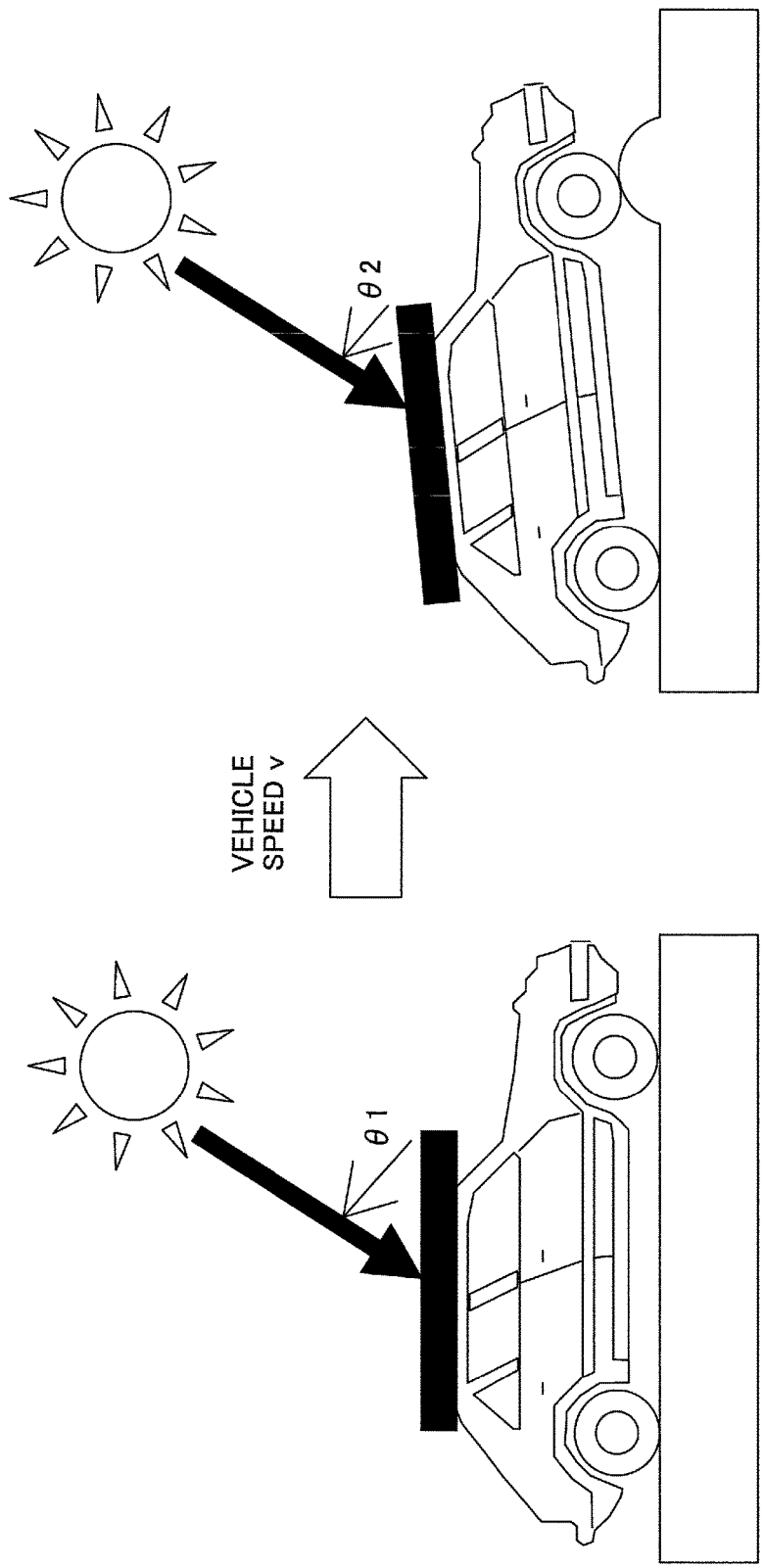

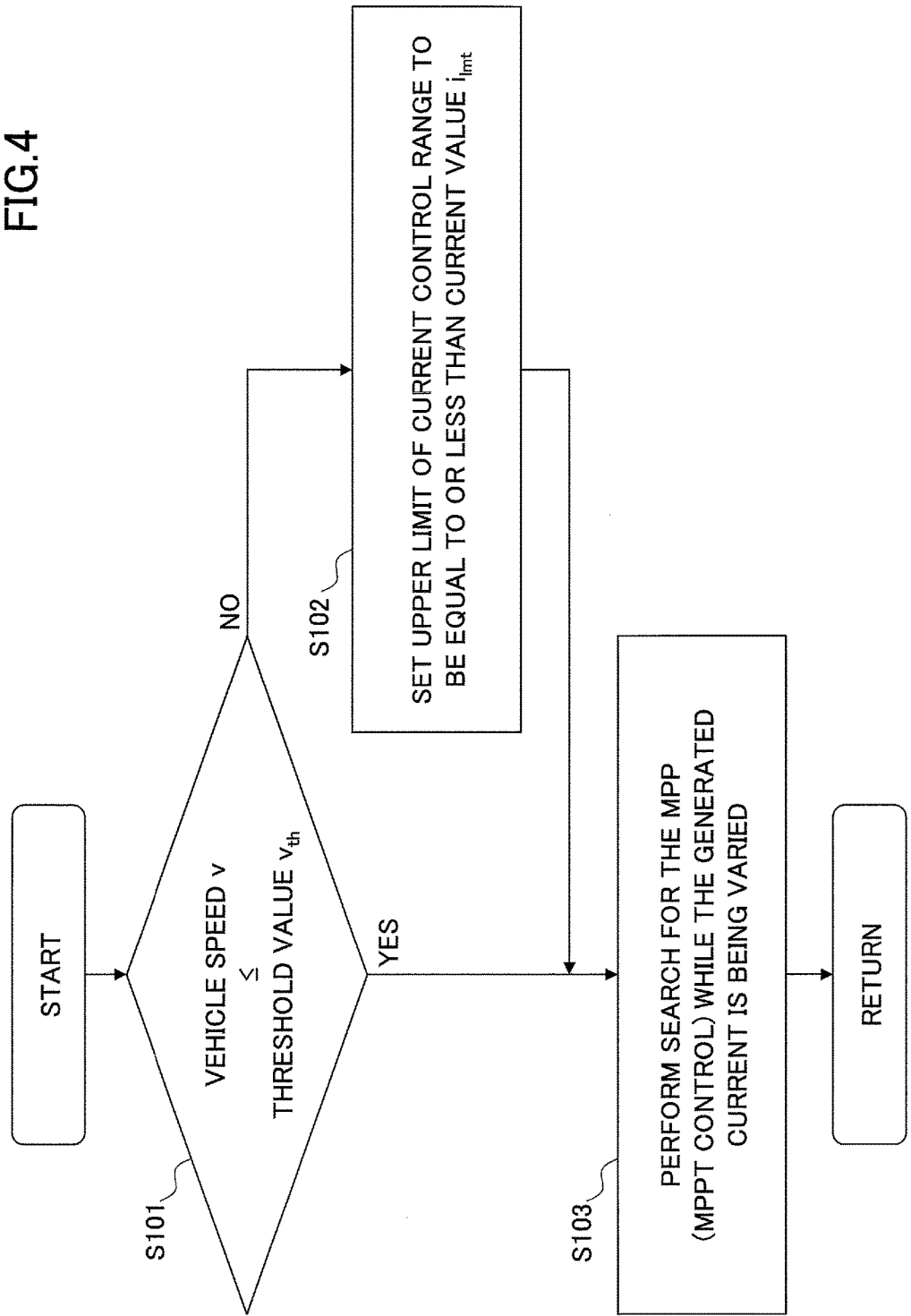

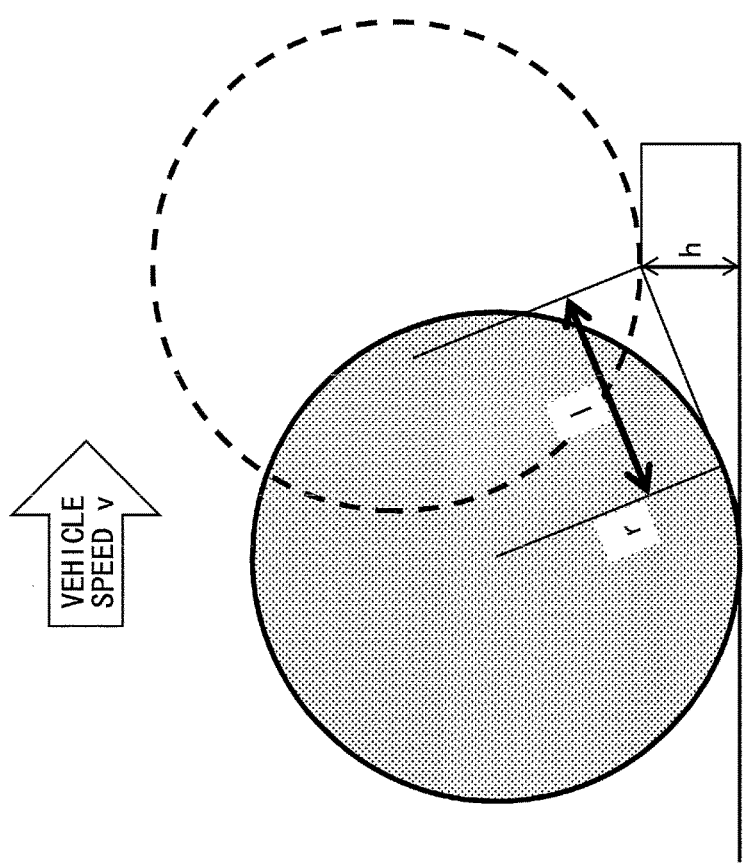
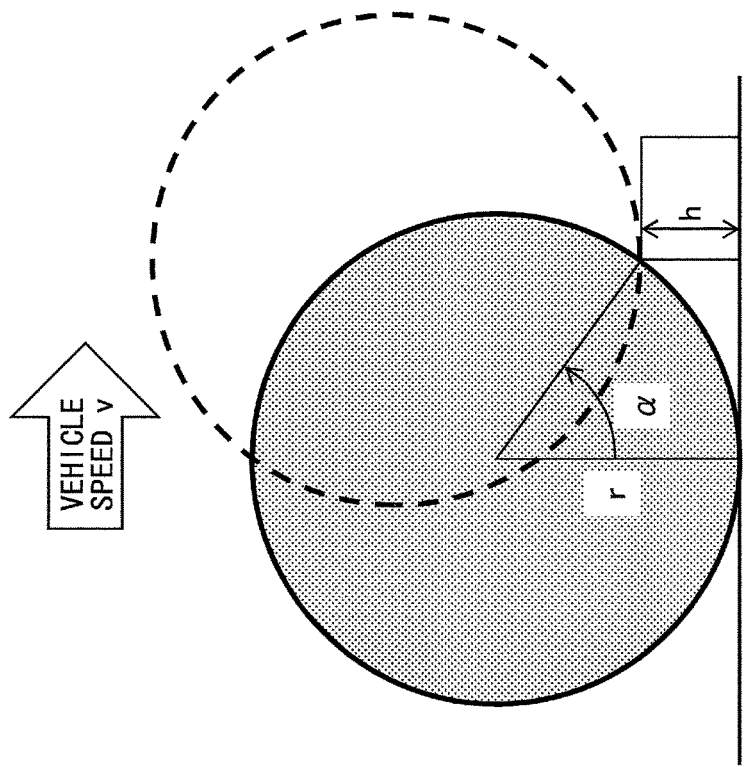

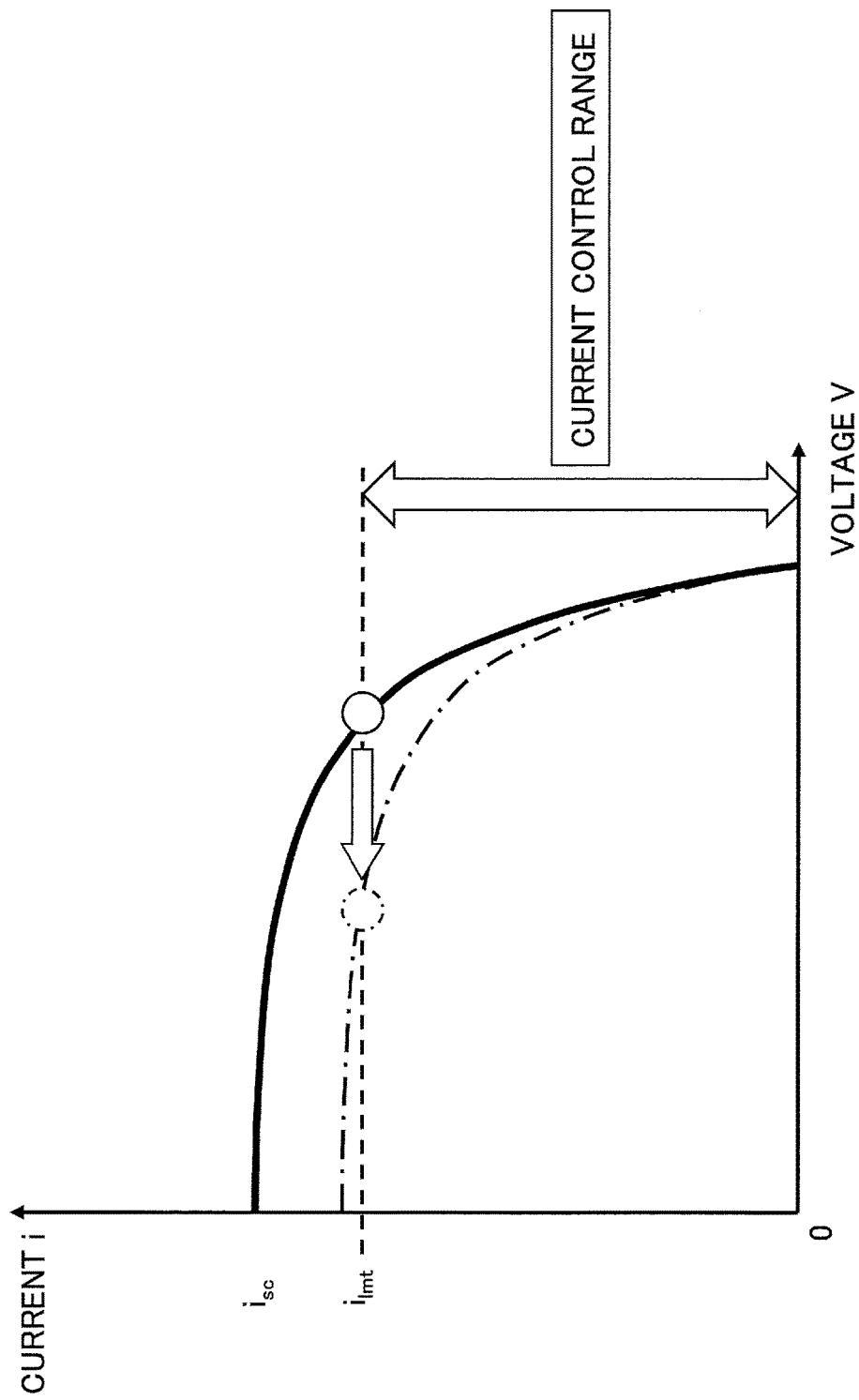

SOLAR BATTERY CONTROL APPARATUS

BACKGROUND OF THE INVENTION

1. Field of the Invention

The present disclosure is related to a solar battery control apparatus installed in vehicle.

2. Description of the Related Art

Output power of a solar battery depends on an output characteristic (i-V output characteristic) of generated current and generated voltage varying in accordance with connected load. A point indicated by the generated current and the generated voltage in the i-V output characteristic which allows the output power of the solar battery to be maximal is referred to maximum power point (MPP).

The i-V output characteristic of a solar battery varies according to sunshine condition, etc., and correspondingly, the MPP also varies. The maximum power point tracking (MPPT) control for tracking the MPP so as to effectively acquire electric power of the solar battery is known (for example, see Patent Document 1).

In the MPPT control, usually, the MPP is searched for while varying the generated voltage or the generated current by controlling a load circuit such as a DC-DC converter connected to the solar battery. That is, in the MPPT control, usually, the generated voltage and the generated current are used as control variables for searching for the MPP.

Here, in a solar battery panel in which a plurality of solar cells are connected in series for enlarging voltage output capability, or the like, generally, a circuit configuration is adopted where a bypass diode is disposed so that the current flows bypassing a part of the solar cells in a case where the part of the solar cells are in a shadow (occurrence of a partial shadow). Therefore, upon the occurrence of the partial shadow, the generated voltage of the solar battery panel or the like may rapidly vary (decrease).

In such case, if the MPP is searched for with the generated voltage as a control variable, the MPPT control may be inappropriately performed due to the rapid decrease of the generated voltage of the solar battery panel caused by the occurrence of the partial shadow, and consequently, the generated current of the solar battery panel may become "0", that is, the output power may become "0". Therefore, when performing the MPPT control with the generated current as a control variable, a strong resistance against the rapid variance of the generated voltage can be obtained, which is caused by the occurrence of the partial shade with respect to the solar battery panel or the like.

However, in a case where the MPPT control is performed with the generated current as a control variable in the solar battery installed in the vehicle, problems described below may be caused.

For example, in a case where a vehicle having a solar battery disposed on a roof panel thereof is traveling on a flat road as shown in FIG. 1A to raise only its front wheels onto a step on a road as shown in FIG. 1B, a solar radiation angle to the solar battery changes from $\theta 1$ into $\theta 2$. Since the angle $\theta 1$ is greater than the angle $\theta 2$, as shown in FIG. 2A and FIG. 2B, solar radiation intensity in the solar battery decreases rapidly to cause the i-V output characteristic of the solar battery to rapidly vary in a case where the front wheels of the vehicle are raised onto the step of the road as shown in FIG. 1B.

FIG. 2A is a diagram for illustrating an example of the i-V output characteristic of the solar battery corresponding to a state of vehicle shown in FIG. 1A. FIG. 2B is a diagram for illustrating an example of the i-V output characteristic (a solid line) of the solar battery corresponding to a state of vehicle shown in FIG. 1B. Additionally, a dashed line shown in FIG. 2B shows the same i-V output characteristic of the solar battery shown in FIG. 2A.

As shown in FIG. 2A and FIG. 2B, when the state of the vehicle transitions from the state shown in FIG. 1A into the state shown in FIG. 1B where its wheels are raised onto the step, short-circuiting current in the i-V output characteristic is reduced, while a release voltage in the i-V output characteristic changes little. Then, as shown in FIG. 2B, a setting value of the generated current as the control variable becomes greater than the short-circuiting current, and consequently, the corresponding generated voltage fails to be found and becomes "0", which causes the output power to rapidly move to "0".

Thus, in a case where the MPPT control is performed with the generated current as the control variable, the output power from solar battery installed in the vehicle may not be stable since the i-V output characteristic of the solar battery installed in the vehicle may rapidly vary in accordance with the movement of the travelling vehicle.

RELATED ART DOCUMENT

Patent Document

[Patent Document 1] International Publication No. 2014/091777

SUMMARY OF THE INVENTION

An object of the present disclosure is to provide a solar battery control apparatus capable of stabilizing output power of a solar battery installed in a vehicle in a case where a MPPT control is performed with generated current of the solar battery as a control variable.

The following configuration is adopted to achieve the aforementioned object.

In one aspect of the embodiment, there is provided a solar battery control apparatus comprising: a solar battery installed in a vehicle; a vehicle speed detecting unit configured to detect a speed of the vehicle; a load circuit connected to the solar battery and configured to be capable of being controlled to vary a generated current input thereto from the solar battery; and a control unit configured to perform Maximum Power Point Tracking MPPT control to search for a Maximum Power Point MPP of the solar battery while controlling the load circuit to vary the generated current of the solar battery, wherein the control unit varies the generated current within a range having a certain upper limit value upon the speed of the vehicle being detected by the vehicle speed detecting unit to be greater than a predetermined speed; wherein the predetermined speed is set to be less than a speed of the vehicle at which the generated current in the MPPT control becomes unable to be varied to correspond to a change in an i-V output characteristic of the generated current and a generated voltage of the solar battery, the change being caused by a variance of a solar radiation angle to the solar battery according to movement of the traveling vehicle, and the certain upper limit value is set to be less than a value of short-circuiting current of the solar battery having been reduced according to the change in the i-V output characteristic.

Other objects, features and advantages of the present invention will become more apparent from the following detailed description when read in conjunction with the accompanying drawings.

BRIEF DESCRIPTION OF THE DRAWINGS

FIG. 1A is a diagram for illustrating a vehicle travelling on a flat road;

FIG. 1B is a diagram for illustrating a vehicle whose front wheels are raised onto a step;

FIG. 4 is a flowchart for illustrating an example of a MPPT control process performed by a solar battery control apparatus (control unit) of the present embodiment;

FIG. 6A is a diagram for illustrating a state of the front wheels of the vehicle before being raised onto the convex-shaped step and after being raised onto the step;

FIG. 6B is another diagram for illustrating a state of the front wheels of the vehicle before being raised onto a sloping-shaped step and after being raised onto the step;

FIG. 8 is a diagram for illustrating a relationship between an upper limit current value and an operational point after the i-V output characteristic is varied according to movement of the vehicle.

DETAILED DESCRIPTION OF THE PREFERRED EMBODIMENTS

In the following, embodiments are described in detail with reference to appended drawings.

Figure 3:
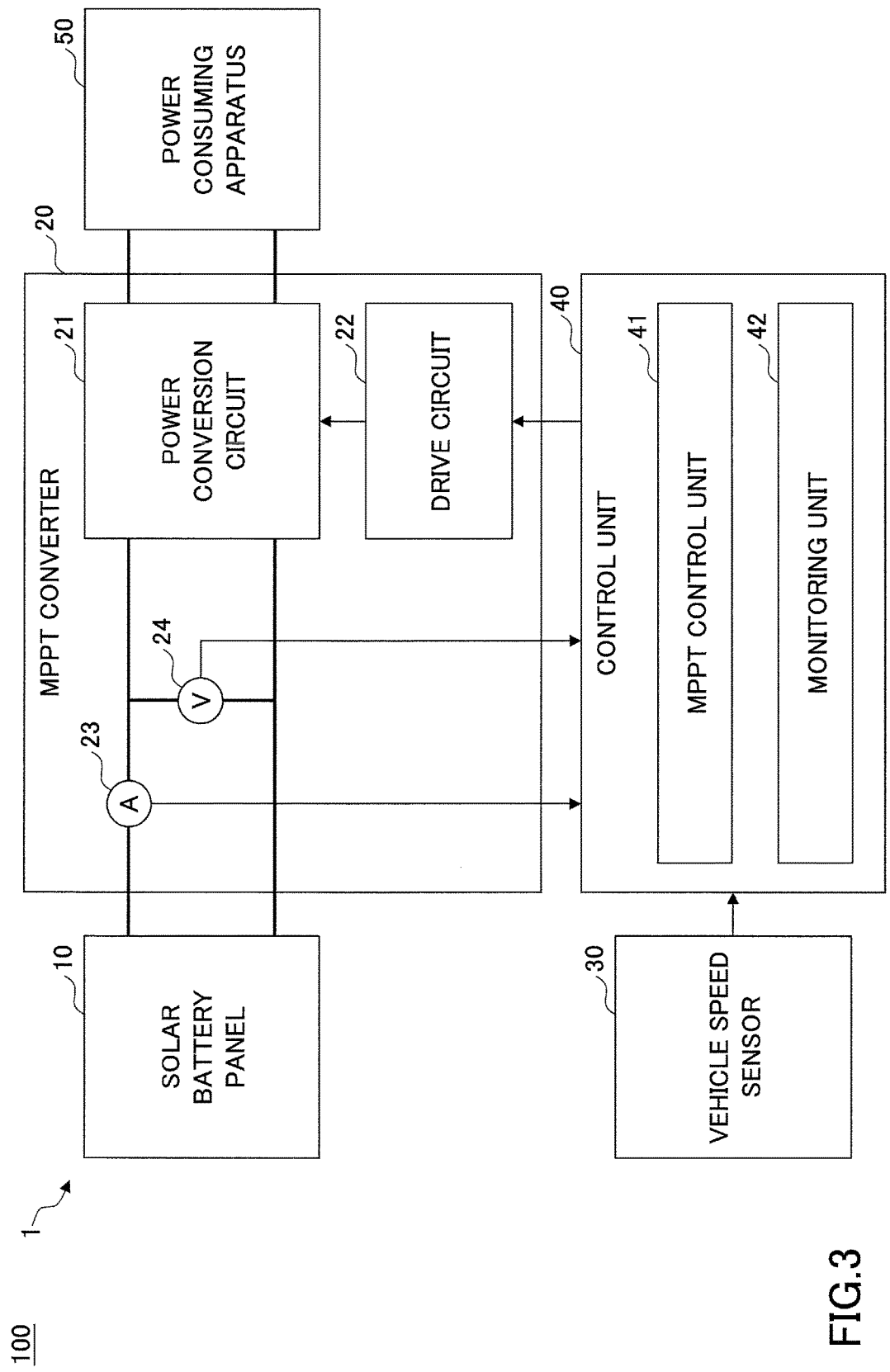
FIG. 3 is a block diagram for illustrating an example configuration of a vehicle including a solar battery control apparatus of the present embodiment.

FIG. 3 is a block diagram for illustrating an example configuration of a vehicle 100 including a solar battery control apparatus 1 of the present embodiment.

The solar battery control apparatus 1 includes a solar battery panel 10, a MPPT converter 20, a vehicle speed sensor 30, a control unit 40, a power consuming apparatus 50, etc., and performs the maximum power point tracking (MPPT) control of the solar battery panel 10 installed in the vehicle 100. Also, the solar battery control apparatus 1 converts the generated energy of the solar battery panel 10 into electric power (voltage) being optimized for the power consuming apparatus 50 by using the MPPT converter 20, thereby outputting the converted electric power to the power consuming apparatus 50.

The solar battery panel 10 is a panel shaped module capable of providing voltage and current required in the power consuming apparatus 50, including a plurality of solar cells connected in series and connected in parallel therein. The solar battery panel 10 is disposed on a part (for example, roof panel surface, etc.) of the vehicle 100 having good sun exposure. The solar cells suitable for vehicle use may be arbitrarily chosen to be included in the solar battery panel 10.

The MPPT converter 20 is a load circuit for performing the MPPT control of the solar battery panel 10. Also, the MPPT converter 20 is an electric power conversion means for converting a state (voltage) of the generated power of the solar battery panel 10 into that suitable for the power consuming apparatus 50. The MPPT converter 20 includes a power conversion circuit 21, a drive circuit 22, a current sensor 23, a voltage sensor 24 and the like.

The power conversion circuit 21 is a DC-DC converter circuit for converting DC power provided from the solar battery panel 10 into DC power suitable for the power consuming apparatus 50 (for example, stepping-up the voltage thereof), including a circuit configuration capable of controlling the generated current provided from the solar battery panel 10. For example, the power conversion circuit 21 may be a known non-insulation type DC-DC converter circuit including reactors, switching elements such as a plurality of IGBTs (Insulated Gate Bipolar Transistor), reflex diodes and the like. The power conversion circuit 21 is operated based on a drive signal (PWM signal provided to the gate terminals of the respective switching elements) from the drive circuit 22.

The drive circuit 22 is a driving means for driving the power conversion circuit 21 according to control instructions of the control unit 40. As described below, the control unit 40 performs feedback control based on the generated current of the solar battery panel 10 detected by the current sensor 23 so that the value of the generated current of the solar battery panel 10 becomes a predetermined current value, and sends a control instruction including duty ratio of the PWM signal and the like to the drive circuit 22. The drive circuit 22 generates the drive signal (PWM signal) of the power conversion circuit 21 according to the control instructions received from the control unit 40, thereby outputting it to the power conversion circuit (gate terminals of respective switching elements).

The current sensor 23 is a known current detecting means for detecting the generated current provided from the solar battery panel 10 to the MPPT converter 20. The current sensor 23 is connected to the control unit 40 being able to communicate with it. A signal corresponding to the generated current of the solar battery panel 10 detected by the current sensor 23 is sent to the control unit 40.

The voltage sensor 24 is a known voltage detecting means for detecting the generated voltage provided from the solar battery panel 10 to the MPPT converter 20. The voltage sensor 24 is connected to the control unit 40 being able to communicate with it. A signal corresponding to the generated voltage of the solar battery panel 10 detected by the voltage sensor 24 is sent to the control unit 40.

The vehicle speed sensor 30 is a known vehicle speed detecting means for detecting the speed of the vehicle 100. The vehicle speed sensor 30 is connected to the control unit 40 through an on-vehicle LAN or a direct line, being able to communicate with it. A vehicle speed signal corresponding to the speed of the vehicle 100 detected by the vehicle speed sensor 30 is sent to the control unit 40.

The control unit 40 is a controlling means for performing the MPPT control of the solar battery panel 10 by using the MPPT converter 20. The control unit 40 includes a MPPT control unit 41 and a monitoring unit 42 as specific controlling means.

Additionally, for example, the control unit 40 may be configured with a microcomputer, etc., and perform respective processes by executing programs stored in a ROM by a CPU. Also, respective functions of the MPPT control unit 41 and the monitoring unit 42 may be achieved by executing corresponding programs by the CPU.

The MPPT control unit 41 searches for a MPP (Maximum Power Point) based on (signals corresponding to) the generated current and the generated voltage of the solar battery panel 10 detected by the current sensor 23 and the voltage sensor 24, while the generated current of the solar battery panel 10 provided to the MPPT converter 20 is being varied by controlling the MPPT converter 20.

Specifically, the MPPT control unit 41 performs the feedback control based on the generated current of the solar battery panel 10 detected by the current sensor 23 so that the value of the generated current of the solar battery panel 10 becomes the predetermined current value. More specifically, the MPPT control unit 41 calculates, based on the generated current of the solar battery panel 10 detected by the current sensor 23, the duty ratio of the respective switching elements included in the power conversion circuit 21, and thereby outputs the control instruction including the duty ratio of the PWM signal to the drive circuit 22. Also, the MPPT control unit 41 acquires the generated current and the generated voltage of the solar battery panel 10 from the current sensor 23 and the voltage sensor 24 in a steady state, where the value of the generated current of the solar battery panel 10 becomes approximately equal to the predetermined current value in a steady state through the feedback control. The MPPT control unit 41 searches for the MPP of the solar battery panel 10 by repeating the aforementioned operation while the predetermined current value is being varied.

Additionally, an arbitrary method for searching for the MPP while the generated current of the solar battery 10 is being varied may be chosen as a specific method (algorithm) of the MPPT control performed by the MPPT control unit 41. For example, a known searching algorithm such as a hill-climbing method or increased conductance method may be chosen.

The monitoring unit 42 monitors a vehicle speed v of the vehicle 100. Specifically, the monitoring unit 42 monitors the vehicle speed v of the vehicle 100 detected by the vehicle speed sensor 30 to determine whether it is equal to or less than a certain threshold value $v_{th}$. When the vehicle speed v of the vehicle 100 exceeds the certain threshold value an upper limit of a current control range (range of variance of the generated current) in the MPPT control performed by the MPPT control unit 41 is set to be equal to or less than a current value $i_{lmt}$.

Additionally, a detailed descriptions of the MPPT control process performed by the control unit 40 (MPPT control unit 41 and monitoring unit 42) and effects thereof, etc., will be given below.

The power consuming apparatus 50 is an on-vehicle apparatus to which the generated power of the solar battery panel 10 is provided. The power consuming apparatus 50 may include an electric load being fed by the generated power of the solar battery panel 10, a power conversion apparatus for converting a state of the generated power into a predetermined state of electric power (for example converting into AC power), or a storage apparatus for accumulating the generated power such as a battery or a capacitor.

In the following, a specific process of the MPPT control performed by the control unit 40 will be described.

FIG. 4 is a flowchart for illustrating an example of control process (MPPT control process of solar battery panel 10) performed by the solar battery control apparatus 1 (control unit 40) of the present embodiment.

Additionally, the process shown in FIG. 4 is performed in every control period. Also, the control period may be variable according to other conditions.

In step S101, the control unit 40 (monitoring unit 42) determines whether the vehicle speed v of the vehicle 100 detected by the vehicle speed sensor 30 (calculated based on a vehicle speed signal received from the vehicle speed sensor 30) is equal to or less than the threshold value $v_{th}$. The process proceeds to step S103 in a case where the vehicle speed v is equal to or less than the threshold value $v_{th}$, while proceeding to step S102 in a case where the vehicle speed v is greater than the threshold value $v_{th}$.

In step S102, the control unit 40 (monitoring unit 42) sets an upper limit of a current control range (range of variance of the generated current of the solar battery panel 10) in the MPPT control (step S103) performed by the MPPT control unit 41 to be equal to or less than a current value then, the process proceeds to step S103.

In step S103, the control unit 40 (the MPPT control unit 41) performs a search for the MPP (MPPT control) while the generated current of the solar battery panel 10 is being varied.

In short, in a case where the vehicle speed v of the vehicle 100 is determined to be equal to or less than the threshold value $v_{th}$, the MPPT control unit 41 performs the MPPT control without limiting the current control range.

Meanwhile, in a case where the vehicle speed v is determined to be greater than the threshold value $v_{th}$, the MPPT control unit 41 performs the MPPT control while setting the upper limit of the current control range to be equal to or less than a current value $i_{lmt}$.

Additionally, the current value $i_{lmt}$ is set to be at least less than the value of the short-circuiting current in the i-V output characteristic (varying in accordance with time and date (solar radiation angle)) of the solar battery panel 10.

As described above, by setting the upper limit of the current control range in the MPPT control to be equal to or less than the current value $i_{lmt}$ upon the vehicle speed being determined to be relatively high ($v > v_{th}$), the output power of the solar battery panel 10 installed in the vehicle 100 can be stabilized.

Specifically, the posture of the vehicle 100 with respect to the direction of solar radiation is varied in accordance with a road shape (curve, intersection, etc.), a driving operation based on a travelling environment such as a traffic state, or movement of the vehicle 100 caused by the variance of a road surface inclination. Therefore, the solar radiation angle to the solar battery panel 10 installed in the vehicle 100 is varied in accordance with the movement of the vehicle 100. The variance of the solar radiation angle to the solar battery panel 10 causes the output characteristic (i-V output characteristic) of the generated current and the generated voltage of the solar battery panel 10 to be varied.

Figure 2A:
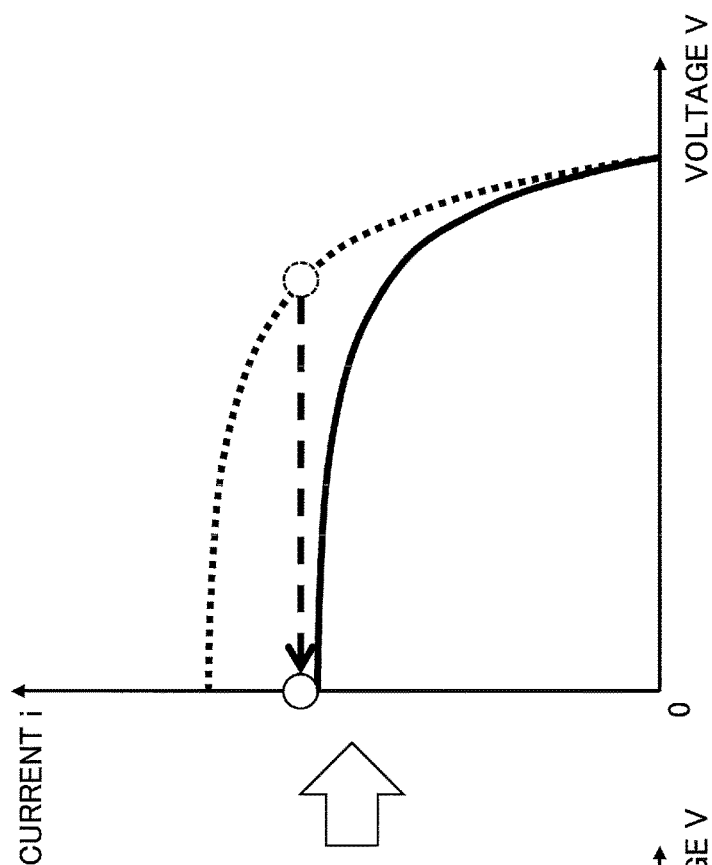
FIG. 2A is a diagram for illustrating an example of an i-V output characteristic of the solar battery corresponding to a state of vehicle shown in FIG. 1A.
Figure 2B:
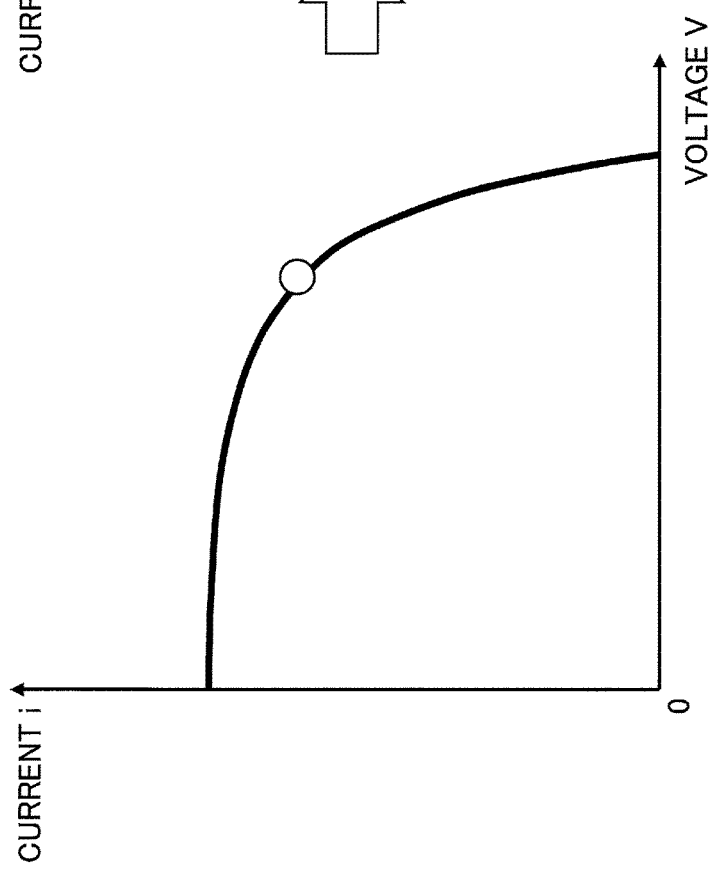
FIG. 2B is a diagram for illustrating an example of the i-V output characteristic of the solar battery corresponding to a state of vehicle shown in FIG. 1B.

As shown in FIG. 2B, when the solar radiation angle decreases, the i-V output characteristic of the solar battery panel 10 is varied to reduce the short-circuiting current in the i-V output characteristic. Therefore, if the control unit 40 controls the value of the generated current to become the predetermined current value which is greater than a value of the short-circuiting current in the i-V output characteristic after being varied, the corresponding generated voltage of the solar battery panel 10 fails to be found and becomes "0", that is, the output power becomes "0", which may cause the solar battery panel 10 to be incapable of stably outputting the electric power.

Meanwhile, in the MPPT control by the MPPT control unit 41, if the generated current can be varied to track the variance of the i-V output characteristic of the solar battery panel 10 caused by the variance of the solar radiation angle to the solar battery panel 10, the solar battery panel 10 can stably output the electric power.

However, the variance of the posture of the vehicle 100 caused by the driving operation, the state of the road surface, the variance of a road surface inclination, etc., becomes rapid as the vehicle speed is increased. Therefore, in a case where the vehicle speed is increased to be relatively high, depending on the assumed movement of the vehicle 100, the variance of the i-V output characteristic of the solar battery panel 10 in accordance with the variance of the solar radiation angle to the solar battery panel 10 may not be able to be tracked in the MPPT control varying the generated current by the MPPT control unit 41. That is, a speed of the current variance caused by the movement of the vehicle 100 may exceed a speed of the current variance (limit speed of the current variance in the MPPT control) which can be tracked in the MPPT control. Additionally, "speed of the current variance caused by the movement of the vehicle 100" means a speed of variance (decrease) in the value of the generated current (short-circuiting current) output by the solar battery panel 10 in accordance with the variance of the i-V output characteristic of the solar battery panel 10 caused by the movement of the vehicle 100.

Therefore, by limiting the current control range choosing an appropriate threshold value $v_{th}$ and a current value $i_{lmt}$, where the upper limit of the current control range in the MPPT control is set to be equal to or less than the current value $i_{lmt}$ upon the vehicle speed V of the vehicle 100 being determined to be greater than the threshold value $v_{th}$, the output power of the solar battery panel 10 installed in the vehicle 100 can be stabilized.

Additionally, "the current variance which can be tracked in the MPPT control" means the current variance with which the MPPT control can be continued without having the output power be "0" even if the short-circuiting current is varied (reduced) in accordance with the variance of the i-V output characteristic of the solar battery panel 10. Meanwhile, in a case where the current variance cannot be tracked in the MPPT control, the output power decreases to "0" to terminate the MPPT control if the short-circuiting current is varied (reduced) in accordance with the variance of the i-V output characteristic of the solar battery panel 10.

In the following, a method for setting the threshold value $v_{th}$ and current value $i_{lmt}$ will be described with reference to specific examples.

Figure 5A:
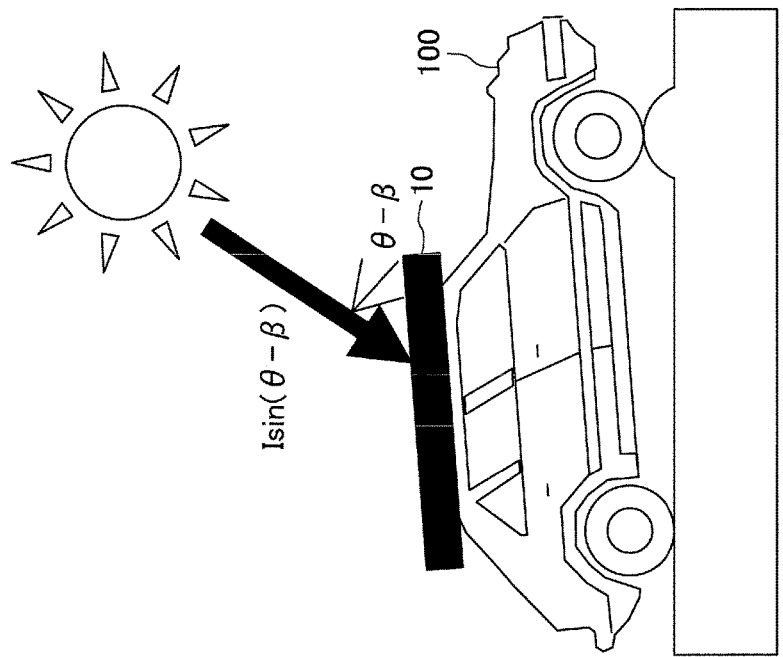
FIG. 5A is a diagram for illustrating a vehicle travelling on the flat road surface.
Figure 5B:
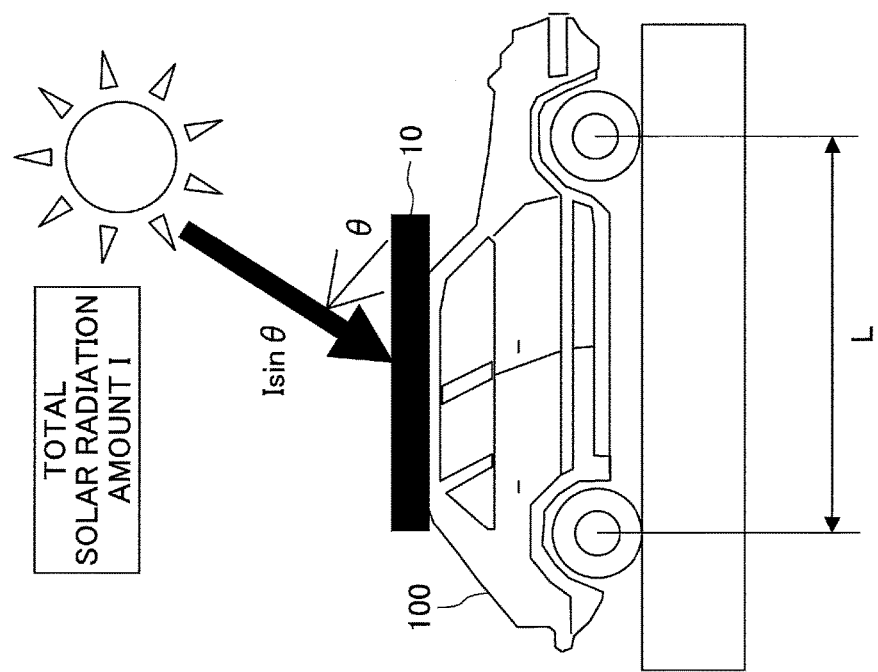
FIG. 5B is a diagram for illustrating the vehicle raising only its front wheels on a step.

FIG. 5A and FIG. 5B show an example variance of the solar radiation angle to the solar battery panel 10 in a case where the vehicle 100 has been traveling on a flat road surface, then raises its front wheels on a step on the road surface. FIG. 5A is a diagram for illustrating the vehicle 100 travelling on the flat road surface. FIG. 5B is a diagram for illustrating the vehicle 100 raising only its front wheels on a step (upward protruding shape) of height "h".

Additionally, in the example, the solar battery panel 10 is disposed on the surface (upper surface) of the roof panel of the vehicle 100, and the solar battery panel 10 is flat and disposed so as to be in horizontal state when the vehicle 100 is travelling on flat road surface. Also, in the example, the vehicle 100 is travelling in a direction toward the sun. Additionally, the variance of the i-V output characteristic of the solar battery panel 10 in accordance with the movement of the vehicle 100 in the specific example described below is similar to the variance of the i-V output characteristic of the solar battery panel 10 in a case where the vehicle 100 is travelling on a flat road in a direction opposite to the sun and raises its rear wheels on a step. That is, descriptions similar to the descriptions given below may be given in a case where the vehicle 100 raises only its rear wheels on the step. Similarly, the descriptions given below may be applied to a case where only front wheels or rear wheels of the vehicle 100 have fallen in a hollow (concave shape) of the road surface.

As shown in FIG. 5A, the solar radiation angle to the solar battery panel 10 becomes e when the vehicle 100 is travelling on a flat road surface and the solar battery panel 10 is in a horizontal state. That is, solar radiation intensity in the solar battery panel 10 can be expressed by I×sin θ, wherein a total solar radiation amount is "I". Also, as shown in FIG. 5B, when the state of the vehicle 100 has transitioned to a state where only front wheels thereof are raised onto the step, the solar radiation angle to the solar battery panel 10 is changed into angle θ-β since the solar battery panel 10 is inclined to back side of the vehicle 100 by an angle β from the horizontal state. That is, the solar radiation intensity in the solar battery panel 10 can be expressed by I×sin(θ-β).

Additionally, elements (variance of light reflectivity or transmittance caused by the configuration of the solar battery panel 10, etc.) other than the solar radiation angle may be taken into account to define the solar radiation intensity in the solar battery panel 10. Also, the angle β (radian) is expressed by formula (1), wherein "L" shows a wheelbase of the vehicle 100 and "h" shows the height of the step.

[Math. 1]

$$\beta = \arcsin(h/L) \qquad (1)$$

FIG. 6A and FIG. 6B show a process of transition where the vehicle 100 shown in FIG. 5A and FIG. 5B has been travelling on the flat road surface, then raises only its front wheels onto the step. FIG. 6A is a diagram for illustrating a state of the front wheels of the vehicle 100 before being raised onto the convex-shaped step (height "h") and after being raised onto the step. The front wheel before being raised onto the convex-shaped step is shown with a solid line while the front wheel after being raised onto the convex-shaped step is shown with a dotted line. FIG. 6B is another diagram for illustrating a state of the front wheels of the vehicle 100 before being raised onto a sloping-shaped step (for example, a speed bump on the road surface) and after being raised onto the step. The front wheel before being raised onto the sloping-shaped step is shown with a solid line while the front wheel after being raised onto the sloping-shaped step is shown with a dotted line.

In the example shown in FIG. 6A, the travelling distance of the vehicle 100 in a period from a timing at which the front wheel of the vehicle 100 reaches (touches) the convex-shaped step (height "h") to a timing at which the front wheel is raised on the step is calculated by multiplying radius "r" of the front wheel of the vehicle 100 by an angle α (radian), wherein the angle α is a rotational angle of the front wheel within the period. Thus, using the vehicle speed "v" of the vehicle 100, the period "t" for transitioning from a state where the vehicle 100 is travelling on the flat road surface to a state where only the front wheel is raised on the step can be expressed as follows: t=rα/v. Similarly, in the example shown in FIG. 6B, using a length "l" between a point where the front wheel of the vehicle 100 reaches (touches) the slope and a point where the front wheel of the vehicle 100 finishes climbing up the slope (shown as a thick line arrow), the period "t" for transitioning from a state where the vehicle 100 is travelling on the flat road surface to a state where only the front wheel is raised on the step can be expressed as follows. t=l/v Additionally, the angle α can be expressed by formula (2).

[Math. 2]

$$\alpha = \arcsin \sqrt{h/2r} \quad (2)$$

In the following, the method for setting the threshold value $v_{th}$ and current value $i_{lmt}$ will be continued to be described assuming the variance of the solar radiation angle to the solar battery panel 10 in accordance with the movement of the vehicle 100 (movement where the front wheels of the vehicle 100 are raised onto the step) shown in FIG. 5A, FIG. 5B and FIG. 6A.

As described above, the output power of the solar battery panel 10 may become unstable (may become "0") when the speed "$di/dt_{\_car}$" of the current variance caused by the movement of the vehicle 100 exceeds the limit speed "$di/dt_{\_mppt}$" of the current variance in the MPPT control, that is, when formula (3) described below is satisfied.

[Math. 3]

$$\frac{di}{dt_{\_car}} \geq \frac{di}{dt_{\_mppt}} \quad (3)$$

The speed "$di/dt_{\_car}$" of the current variance caused by the movement of the vehicle 100 shown in FIG. 5A, FIG. 5B and FIG. 6A is expressed by formula (4).

[Math. 4]

$$\frac{di}{dt_{\_car}} = i_{sc}\left\{1 - \frac{\sin(\theta - \beta)}{\sin\theta}\right\}/(ra/v) \quad (4)$$

In formula (4), "$i_{no}$" indicates a value of the short-circuiting current in the i-V output characteristic of the solar battery panel 10 in a case where the sun light of the total solar radiation amount "I" is irradiated at solar radiation angle θ.

Specifically, the numerator of formula (4) indicates variation of the short-circuiting current caused by the variance of the i-V output characteristic of the solar battery panel 10 in accordance with the movement of the vehicle 100 shown in FIG. 5A, FIG. 5B and FIG. 6A. Also, the denominator of formula (4) indicates a time (period) during which the short-circuiting current varies in accordance with the variance of the i-V output characteristic of the solar battery panel 10 caused by the movement of the vehicle 100. That is, the speed "$di/dt_{\_car}$" of the current variance caused by the movement of the vehicle 100 is found, by dividing the variation (decrease amount) of the short-circuiting current in accordance with the variance of the i-V output characteristic of the solar battery panel 10 by the time during which the short-circuiting current varies in accordance with the variance of the i-V output characteristic of the solar battery panel 10.

The value of the short-circuiting current in the i-V output characteristic of the solar battery panel 10 is approximately proportional to the solar radiation intensity in the solar battery panel 10. Therefore, in a case where the short-circuiting current "isc" before the i-V output characteristic of the solar battery 10 is varied is selected as a reference, the value of the short-circuiting current after being varied is found by multiplying a ratio of the solar radiation intensity in the solar battery 10 before being varied to that after being varied (I×sin(θ−β)/I×sin θ) by the value of the short-circuiting current "isc" before being varied ($i_{sc}$×(sin (θ−β)/sin θ)). Thus, the variation of the short-circuiting current in accordance with the variance of the i-V output characteristic of the solar battery panel 10 caused by the movement of the vehicle 100 shown in FIG. 5A, FIG. 5B and FIG. 6A is expressed by the numerator of formula (4).

Also, the time during which the short-circuiting current varies in accordance with the variance of the i-V output characteristic of the solar battery panel 10 caused by the movement of the vehicle 100 is equal to the period "t" for transitioning from a state where the vehicle 100 is travelling on the flat road surface to a state where only front wheel is raised on the step, and is expressed by the denominator of formula (4).

Additionally, when assuming that the vehicle 100 is climbing up the slope of the step (FIG. 6B), similarly, the speed "$di/dt_{\_car}$" of the current variance caused by the movement of the vehicle 100 can be found by dividing the numerator of formula (4) by the period "t" (=l/v).

The limit speed "$di/dt_{\_mppt}$" of the current variance in the MPPT control is expressed by formula (5).

[Math. 5]

$$\frac{di}{dt_{\_mppt}} = \{(i_{sc} - i_{mpp}) - \Delta i\}/\lambda \quad (5)$$

Additionally, formula (5) is defined assuming that the MPP at which the output power is maximized is searched for using the hill-climbing method as the generated current of the solar battery panel 10 is being varied by every unit control current range Δi. Also, in formula (5), "$i_{mpp}$" indicates a value of MPP current (generated current at MPP) in the i-V output characteristic of the solar battery panel 10 in a case where the sun light of the total solar radiation amount "I" is irradiated at solar radiation angle θ. Further, in formula (5), "λ" indicates a period (control period), wherein the generated current of the solar battery panel 10 is varied by unit control current range Δi in every control period in the MPPT control.

Specifically, the numerator of formula (5) indicates a minimum value of a difference between the short-circuiting current $i_{sc}$ and the generated current in the MPPT control. Also, the denominator of formula (5) is the control period λ indicating the time during which the value of the generated current remains at the value corresponding to the minimum value defined by the numerator of formula (5).

That is, if the value of the short-circuiting current is reduced, in accordance with the variance of the i-V output characteristic of the solar battery panel 10, to be equal to a value of the generated current with which the difference between the short-circuiting current $i_{sc}$ and the generated current in the MPPT control is minimized during the value of the generated current remains at the aforementioned value, the output power becomes "0". Therefore, in formula (5), the limit speed "$di/dt_{\_mppt}$" of the current variance in the MPPT control is found by dividing the minimum value of a difference by the time (control period λ) during which the value of the generated current remains at the value with which the difference between the short-circuiting current $i_{sc}$ and the generated current in the MPPT control is minimized.

Additionally, in the hill-climbing method, since the MPP at which the output power is maximized is searched for as the generated power is varied so as to increase the output power, there is a case where the generated current is increased to a value ($i_{mpp}+\Delta i$) which is greater than the value of the MPP current $i_{mpp}$ by one unit control current range $\Delta i$ (that is, the generated current is varied only one time so as to decrease the output power). Thus, the minimum value of a difference between the short-circuiting current $i_{sc}$ and the generated current in the MPPT control is expressed by the numerator of the formula (5). Also, the MPPT control unit 41 may perform the MPPT control by using another method, and the limit speed "$di/dt\_{mppt}$" of the current variance in the MPPT control may be calculated according to the other method (according to an algorithm for searching for the MPP or a control period).

Thus, if formula (6) described below defined by substituting formula (4) and formula (5) into formula (3) is satisfied with the vehicle speed v of the vehicle 100, the generated current in the MPPT control may become unable to track the variance of the i-V output characteristic of the solar battery panel 10 caused by the assumed movement of the vehicle 100. That is, the output power of the solar battery panel 10 may become unstable.

[Math. 6]

$$v \geq rai_{sc}\left\{1-\frac{\sin(\theta-\beta)}{\sin\theta}\right\}/\lambda\{(i_{sc}-i_{mpp})-\Delta i\} \quad (6)$$

Here, the threshold value $v_{th}$ is required to be less than the vehicle speed at which the generated current in the MPPT control becomes unable to track the variance of the i-V output characteristic of the solar battery panel 10 caused by the movement of the vehicle 100, in order to stabilize the output power of the solar battery panel 10. Therefore, in the present embodiment, the threshold value $v_{th}$ is preferably set to be a value less than a right side value of formula (6).

As described above, the limit speed of the current variance in the MPPT control is compared with the speed of the current variance caused by the assumed movement of the vehicle 100, thereby setting the threshold value $v_{th}$ to be a value less than the vehicle speed of the vehicle 100 at which the speed of the current variance caused by the movement of the vehicle 100 becomes greater than or equal to the limit speed of the current variance in the MPPT control. Thus, the current control range of the MPPT control is limited (setting the upper limit current value $i_{lmt}$) in a total range of the vehicle speed where the generated current in the MPPT control is unable to be varied tracking the variance of the i-V output characteristic of the solar battery panel 10 caused by the movement of the vehicle 100, thereby stabilizing the output power of the solar battery panel 10.

Additionally, among parameters for determining the threshold value $v_{th}$, the solar radiation angle $\theta$ varies according to date, time, a position (latitude) of the vehicle 100, a travelling direction of the vehicle 100, and the like. Therefore, the threshold value $v_{th}$ should be timely changed in accordance with the date, the time, the position (latitude) of the vehicle 100, the travelling direction of the vehicle 100, and the like. For example, a map indicating association between the solar radiation angle $\theta$ and the date, the time, the position (latitude) of the vehicle 100, and the travelling direction of the vehicle 100 has been stored in an internal memory of the control unit 40 in advance. The control unit 40 may determine the solar radiation angle $\theta$ based on the position and the travelling direction of the vehicle 100 and the time extracted from a GPS signal received by a GPS receiver (not shown) or based on date defined by an onboard clock, and thereby determines the threshold value $v_{th}$ according to the determined solar radiation angle $\theta$ by referring to the map.

Also, since the i-V output characteristic of the solar battery panel 10 varies according to the sunshine condition (such as solar radiation angle $\theta$), the short-circuiting current $i_{sc}$ and the MPP current $i_{mpp}$ are preferably changed according to the sunshine condition (such as solar radiation angle $\theta$). For example, a map indicating association between the sunshine condition (such as solar radiation angle $\theta$) and the short-circuiting current $i_{sc}$ and the MPP current $i_{mpp}$ has been stored in an internal memory of the control unit 40 in advance. Preferably, the control unit 40 changes the short-circuiting current and the MPP current according to the solar radiation angle $\theta$, etc., by referring to the map. Also, the sunshine condition may be acquired from an information center or the like outside the vehicle 100 through certain wireless communication network.

Figure 7:
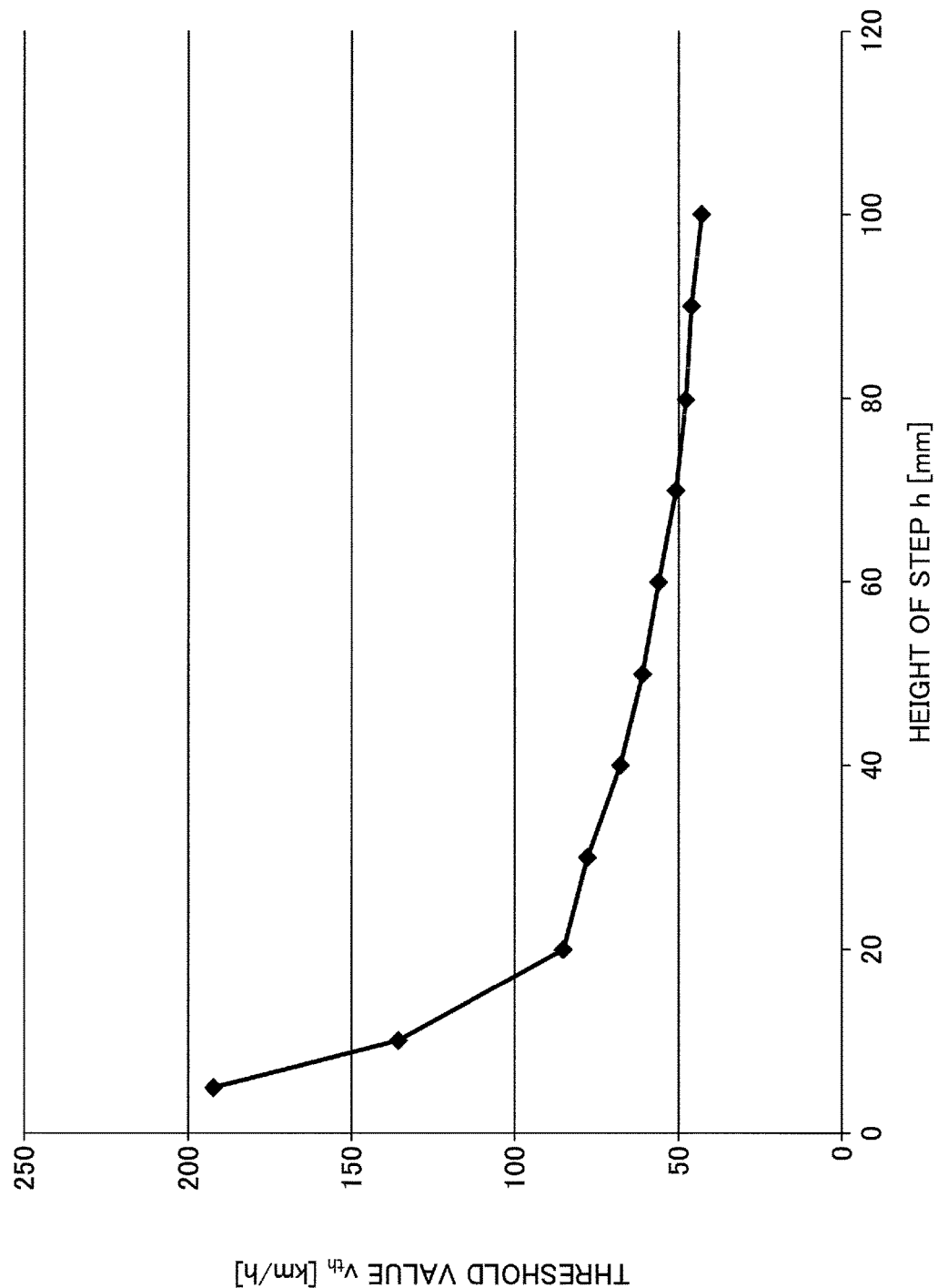
FIG. 7 is a diagram for showing a graph for indicating a relationship between a height of the step and a threshold value.

FIG. 7 is a diagram for showing a graph for indicating a relationship between the height "h" of the convex-shaped step and the threshold value $v_{th}$ in a case where the threshold value $v_{th}$ is set to be the right side value of formula (6), while assuming a condition defined in a table shown below. The respective plot points in FIG. 7 indicate the respective threshold values $v_{th}$ in a case where the height "h" of the step is 5 mm, 10 mm, 20 mm, 30 mm, 40 mm, 50 mm, 60 mm, 70 mm, 80 mm, 90 mm and 100 mm.

TABLE 1

| PARAMETER | | UNIT | VALUE | NOTE |
|---|---|---|---|---|
| SOLAR RADIATION ANGLE | $\theta$ | rad | 0.551524 | LATITUDE 35 DEGREES, CULMINATION ALTITUDE ON WINTER SOLSTICE |
| WHEEL BASE | L | mm | 2700 | |
| RADIUS OF WHEEL (DYNAMIC ROLLING RADIUS) | r | mm | 310.5 | |
| MPP CURRENT | $i_{mpp}$ | A | 8.92 | |
| SHORT-CIRCUITING CURRENT | $i_{sc}$ | A | 9.53 | |
| UNIT CONTROL CURRENT RANGE | $\Delta i$ | A | 0.5 | |
| CONTROL PERIOD | $\lambda$ | s | 0.004 | |

As shown in FIG. 7, the threshold value $v_{th}$ needs to be set lower as the height "h" of the convex-shaped step becomes greater. That is, the current control range in the MPPT control needs to be limited with the upper limit current value $i_{lmt}$, at a lower vehicle speed as the assumed height "h" of the convex-shaped step becomes greater.

For example, the threshold value $v_{th}$ is 85 km/h when the height "h" of the step is 20 mm while the threshold value $v_{th}$ is 61 km/h when the height "h" of the step is 50 mm, and the threshold value $v_{th}$ is decreased to 48 km/h when the height "h" of the step is 80 mm.

As described above, the height "h" of the step needs to be appropriately chosen in order to appropriately set the threshold value $v_{th}$ assuming the variance of the i-V output characteristic of the solar battery panel 10 caused by the variance of the solar radiation angle to the solar battery panel 10 according to the movement (raised onto the step) of the vehicle 100 caused by the irregularity of the road surface. For example, the height "h" may be chosen for every destination area of the vehicle or the like since a road maintenance state or the like is different by countries and areas. Also, for example, the heights "h" defined for every important road or defined for every type of the road may be stored in an internal memory of the control unit 40 in advance since the road maintenance state or the like may vary according to the type of the road, etc., even in the same country or area. The control unit 40 may receive road information from a car navigation apparatus, which corresponds to the current position of the vehicle 100 defined based on the GPS signal received by the GPS receiver (not shown), and thereby sets the height "h" based on the received road information. Also, information related to the height "h" in the road on which the vehicle 100 is travelling may be acquired from an information center, etc., outside the vehicle 100 through a certain wireless network.

The upper limit current value $i_{lmt}$ needs to be chosen so that the output power of the solar battery panel 10 does not become "0" even after the i-V output characteristic of the solar battery panel 10 is varied according to the movement of the vehicle 100, in order to stabilize the output power of the solar battery panel 10. That is, the upper limit current value $i_{lmt}$ is preferably set to be a value less than the value of the short-circuiting current after the i-V output characteristic of the solar battery panel 10 is varied according to the movement of the vehicle 100. That is, the upper limit current value $i_{lmt}$ is preferably set so as to satisfy formula (7) described below since the short-circuiting current in the i-V output characteristic of the solar battery panel 10 is approximately proportional to the solar radiation intensity in the solar battery panel 10, as described above.

[Math. 7]
$$i_{lmt} < \frac{\sin(\theta - \beta)}{\sin\theta} i_{sc} \quad (7)$$

Additionally, as described above, a right side value of formula (7) (the value of the short-circuiting current after the i-V output characteristic of the solar battery panel 10 is varied according to the movement of the vehicle 100) may be calculated taking into account elements (variance of light reflectivity or transmittance caused by the configuration of the solar battery panel 10, etc.) other than the solar radiation angle. That is, the upper limit current value $i_{lmt}$ may be set taking into account elements (variance of light reflectivity or transmittance caused by the configuration of the solar battery panel 10, etc.) other than the solar radiation angle. Also, in a case where the assumed movement of the vehicle 100 is caused by a factor other than the irregularity of the road surface, the upper limit current value $i_{lmt}$ can be set in a similar manner. That is, formula (7) can be derived with the solar radiation angle ("θ" in formula (7)) before the i-V output characteristic of the solar battery panel 10 is varied according to the assumed movement of the vehicle 100, and the solar radiation angle (θ−β) in formula (7)) after the i-V output characteristic of the solar battery panel 10 is varied.

FIG. 8 is a diagram for illustrating a relationship between the upper limit current value $i_{lmt}$ and an operational point after the i-V output characteristic of the solar battery panel 10 is varied according to the assumed movement of the vehicle 100. Additionally, in FIG. 8, a solid line shows a curve illustrating the i-V output characteristic of the solar battery panel 10 before being varied, while an alternate long and short dash line shows a curve illustrating the i-V output characteristic of the solar battery panel 10 after being varied. Also, the respective circles shown in the respective i-V output characteristics show the operational point (combination of the generated current and generated voltage with which the electric power is output) before the i-V output characteristic is varied and the operational point after the i-V output characteristic is varied.

As shown in FIG. 8, by setting the upper limit current value $i_{lmt}$ to be less than the value of the short-circuiting current in the the i-V output characteristic of the solar battery 10 after being varied, the generated voltage corresponding to the operational point after being varied does not become "0" even if the generated current of the solar battery panel 10 is controlled in the MPPT control so as to become equal to the upper limit current value $i_{lmt}$. That is, the output power of the solar battery panel 10 is prevented from changing to be "0" according to the variance of the i-V output characteristic of the solar battery panel 10 installed in the vehicle 100, thereby stabilizing the output power of the solar battery panel 10.

Herein above, although the invention has been described with respect to a specific embodiment, the appended claims are not to be thus limited. It should be understood that the various changes, substitutions, and alterations could be made hereto without departing from the spirit and scope of the claims. Further, all or part of the components of the embodiments described above can be combined.

For example, in the example described with reference to FIG. 5A, FIG. 5B, FIG. 6A and FIG. 6B, although the solar battery panel 10 has a flat surface, it may have a curved surface (for example, a shape formed along the shape of the roof panel). In this case, the variance of the i-V output characteristic (decrease of the short-circuiting current) of the solar battery panel 10 according to the movement of the vehicle 100 is defined by a solar cell to which the solar radiation angle becomes the smallest among the solar cells included in the solar battery panel 10.

Also, in the embodiment described above, the threshold value $v_{th}$ and the upper limit current value $i_{lmt}$ are set based on the movement of the vehicle 100 in a case where a part of wheels in the vehicle 100 is raised onto (fallen into) a step (a hollow) of the road surface, but the threshold value $v_{th}$ and the upper limit current value $i_{lmt}$ may be set based on other movements of the vehicle 100. For example, threshold value $v_{th}$ and the upper limit current value $i_{lmt}$ may be set assuming rapid deceleration of the vehicle 100, rapid variance in inclination of the road, etc., as factors causing the movement of the vehicle 100 for rapidly varying the solar radiation angle to the solar battery panel 10.

The present application is based on Japanese Priority Application No. 2014-258361, filed on Dec. 22, 2014, the entire contents of which are hereby incorporated by reference.

What is claimed is:
1. A solar battery control apparatus comprising:
a solar battery installed in a vehicle;
a vehicle speed sensor configured to detect a speed of the vehicle;
a load circuit connected to the solar battery and configured to be capable of being controlled to vary a generated current input thereto from the solar battery; and a controller configured to perform Maximum Power Point Tracking (MPPT) control to search for a Maximum Power Point (MPP) of the solar battery while controlling the load circuit to vary the generated current of the solar battery, wherein the controller varies the generated current within a range having a certain upper limit value upon the speed of the vehicle being detected by the vehicle speed sensor to be greater than a predetermined speed; wherein the predetermined speed is set to be less than a speed of the vehicle at which the generated current in the MPPT control becomes unable to be varied to correspond to a change in an i-V output characteristic of the generated current and a generated voltage of the solar battery, the change being caused by a variance of a solar radiation angle to the solar battery according to movement of the vehicle, the certain upper limit value is set to be less than a value of short-circuiting current of the solar battery having been reduced according to the change in the i-V output characteristic, and the certain upper limit value is set such that the generated current of the solar battery is less than a current to be generated at the Maximum Power Point.

2. The solar battery control apparatus as claimed in claim 1, wherein the change in the i-V output characteristic is caused based on the variance of a solar radiation angle to the solar battery according to the movement of the vehicle caused by irregularity of the road surface.

3. The solar battery control apparatus as claimed in claim 1, wherein the certain upper limit value is set based on respective solar radiation angles to the solar battery before the variance and after the variance.

* * * * *